(12) United States Patent
Shirai

(10) Patent No.: US 9,732,437 B2
(45) Date of Patent: Aug. 15, 2017

(54) SIC SINGLE CRYSTAL AND METHOD FOR PRODUCING SAME

(71) Applicant: TOYOTA JIDOSHA KABUSHIKI KAISHA, Toyota-shi, Aichi-ken (JP)

(72) Inventor: Takayuki Shirai, Susono (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/824,811

(22) Filed: Aug. 12, 2015

(65) Prior Publication Data
US 2016/0068993 A1 Mar. 10, 2016

(30) Foreign Application Priority Data

Sep. 9, 2014 (JP) .................................. 2014-183636
Dec. 26, 2014 (JP) .................................. 2014-266724

(51) Int. Cl.
| | | |
|---|---|---|
| H01L 21/00 | (2006.01) |
| C30B 19/10 | (2006.01) |
| C30B 19/02 | (2006.01) |
| C30B 19/06 | (2006.01) |
| C30B 19/08 | (2006.01) |
| C30B 19/12 | (2006.01) |

(Continued)

(52) U.S. Cl.
CPC .............. *C30B 19/10* (2013.01); *C30B 9/06* (2013.01); *C30B 19/02* (2013.01); *C30B 19/04* (2013.01); *C30B 19/062* (2013.01); *C30B 19/067* (2013.01); *C30B 19/08* (2013.01); *C30B 19/106* (2013.01); *C30B 19/12* (2013.01); *C30B 29/36* (2013.01); *H01L 29/04* (2013.01); *H01L 29/1608* (2013.01)

(58) Field of Classification Search
CPC ......... C30B 15/00; C30B 17/00; C30B 29/36; C30B 19/00; C30B 19/02
See application file for complete search history.

(56) References Cited

U.S. PATENT DOCUMENTS 5,539,217 A * 7/1996 Edmond ................. H01L 29/74
257/147
2002/0189536 A1 12/2002 Otsuki et al.
(Continued)

FOREIGN PATENT DOCUMENTS

CN 101203635 A 6/2008
CN 101932757 A 12/2010
(Continued)

Primary Examiner — Trung Q Dang
(74) Attorney, Agent, or Firm — Oliff PLC

(57) ABSTRACT

A low-resistance p-type SiC single crystal containing no inclusions is provided. This is achieved by a method for producing a SiC single crystal wherein a SiC seed crystal substrate 14 is contacted with a Si—C solution 24 having a temperature gradient in which the temperature falls from the interior toward the surface, to grow a SiC single crystal, and wherein the method comprises: using, as the Si—C solution, a Si—C solution containing Si, Cr and Al, wherein the Al content is 3 at % or greater based on the total of Si, Cr and Al, and making the temperature gradient y (° C./cm) in the surface region of the Si—C solution 24 satisfy the following formula (1): y≥0.15789x+21.52632 (1) wherein x represents the Al content (at %) of the Si—C solution.

2 Claims, 4 Drawing Sheets

(51) Int. Cl.
  *C30B 29/36* (2006.01)
  *H01L 29/16* (2006.01)
  *H01L 29/04* (2006.01)
  *C30B 9/06* (2006.01)
  *C30B 19/04* (2006.01)

(56) References Cited

U.S. PATENT DOCUMENTS

| | | | |
|---|---|---|---|
| 2009/0101062 A1 | 4/2009 | Sakamoto | |
| 2009/0194017 A1 | 8/2009 | Terashima et al. | |
| 2010/0289033 A1* | 11/2010 | Ohtani | C30B 29/36 257/77 |
| 2010/0308344 A1 | 12/2010 | Seki et al. | |
| 2012/0132130 A1* | 5/2012 | Nomura | C30B 9/10 117/2 |
| 2012/0304916 A1* | 12/2012 | Ishii | C30B 29/36 117/56 |
| 2015/0167196 A1 | 6/2015 | Kado et al. | |
| 2015/0221511 A1 | 8/2015 | Kado et al. | |

FOREIGN PATENT DOCUMENTS

| | | |
|---|---|---|
| EP | 1895031 A1 | 3/2008 |
| JP | 2003-073194 A | 3/2003 |
| JP | 2008-100890 A | 5/2008 |
| JP | 2009-179491 A | 8/2009 |
| JP | 2009-184879 A | 8/2009 |
| JP | 2014-019614 A | 2/2014 |
| JP | 2014-047096 A | 3/2014 |
| KR | 2008-0009333 A | 1/2008 |
| WO | 2014/013773 A1 | 1/2014 |

\* cited by examiner (a)

(b)

5 mm 5 mm

US 9,732,437 B2

SIC SINGLE CRYSTAL AND METHOD FOR PRODUCING SAME

TECHNICAL FIELD

The present invention relates to a SiC single crystal that is suitable as a semiconductor element, and to a method for producing the same.

BACKGROUND ART

SiC single crystals are thermally and chemically very stable, superior in mechanical strength, and resistant to radiation, and also have superior physical properties, such as high breakdown voltage and high thermal conductivity compared to Si single crystals. They are therefore able to exhibit high output, high frequency, voltage resistance and environmental resistance that cannot be realized with existing semiconductor materials, such as Si single crystals and GaAs single crystals, and are considered ever more promising as next-generation semiconductor materials for a wide range of applications including power device materials that allow high power control and energy saving to be achieved, device materials for high-speed large volume information communication, high-temperature device materials for vehicles, radiation-resistant device materials and the like.

A variety of different measures have been taken to produce high-quality low-resistance p-type SiC single crystals, in order to obtain ultra-high voltage-resistant elements that are considered promising for applications in electrical power systems and the like. PTL 1 proposes a method for producing a p-type SiC single crystal by a solution process using a Si—C solution containing 0.1 to 20 at % Al based on the total amount of Si, Cr and Al.

CITATION LIST

Patent Literature

[PTL 1] Japanese Unexamined Patent Publication No. 2009-184879

SUMMARY OF THE INVENTION

Problems to be Solved by the Invention

However, when it is attempted to fabricate a low-resistance p-type SiC single crystal using prior art technology with the solution process of PTL 1, for example, inclusions tend to be generated in the grown crystal, and therefore it is still difficult to obtain high-quality SiC single crystals. Particularly when a Si—C solution containing a relatively large amount of added Al is used for fabrication of a low-resistance p-type SiC single crystal, there is a notable tendency toward generation of inclusions in the grown crystal, and it has been difficult to obtain a high-quality SiC single crystal. A demand therefore exists for a low-resistance p-type SiC single crystal containing no inclusions.

Means for Solving the Problems

The present disclosure is a method for producing a SiC single crystal wherein a SiC seed crystal substrate is contacted with a Si—C solution having a temperature gradient in which the temperature falls from the interior toward the surface, to grow a SiC single crystal, and wherein the method comprises:

using, as the Si—C solution, a Si—C solution containing Si, Cr and Al, wherein the Al content is 3 at % or greater based on the total of Si, Cr and Al, and making the temperature gradient y (° C./cm) in the surface region of the Si—C solution satisfy the following formula (1):

$$y \geq 0.15789x + 21.52632 \tag{1}$$

wherein x represents the Al content (at %) of the Si—C solution.

The present disclosure also relates to a p-type SiC single crystal containing no inclusions and having resistivity of no greater than 150 mΩ·cm.

Effect of the Invention

According to the present disclosure it is possible to obtain a low-resistance p-type SiC single crystal containing no inclusions.

DESCRIPTION OF EMBODIMENTS

Figure 1:
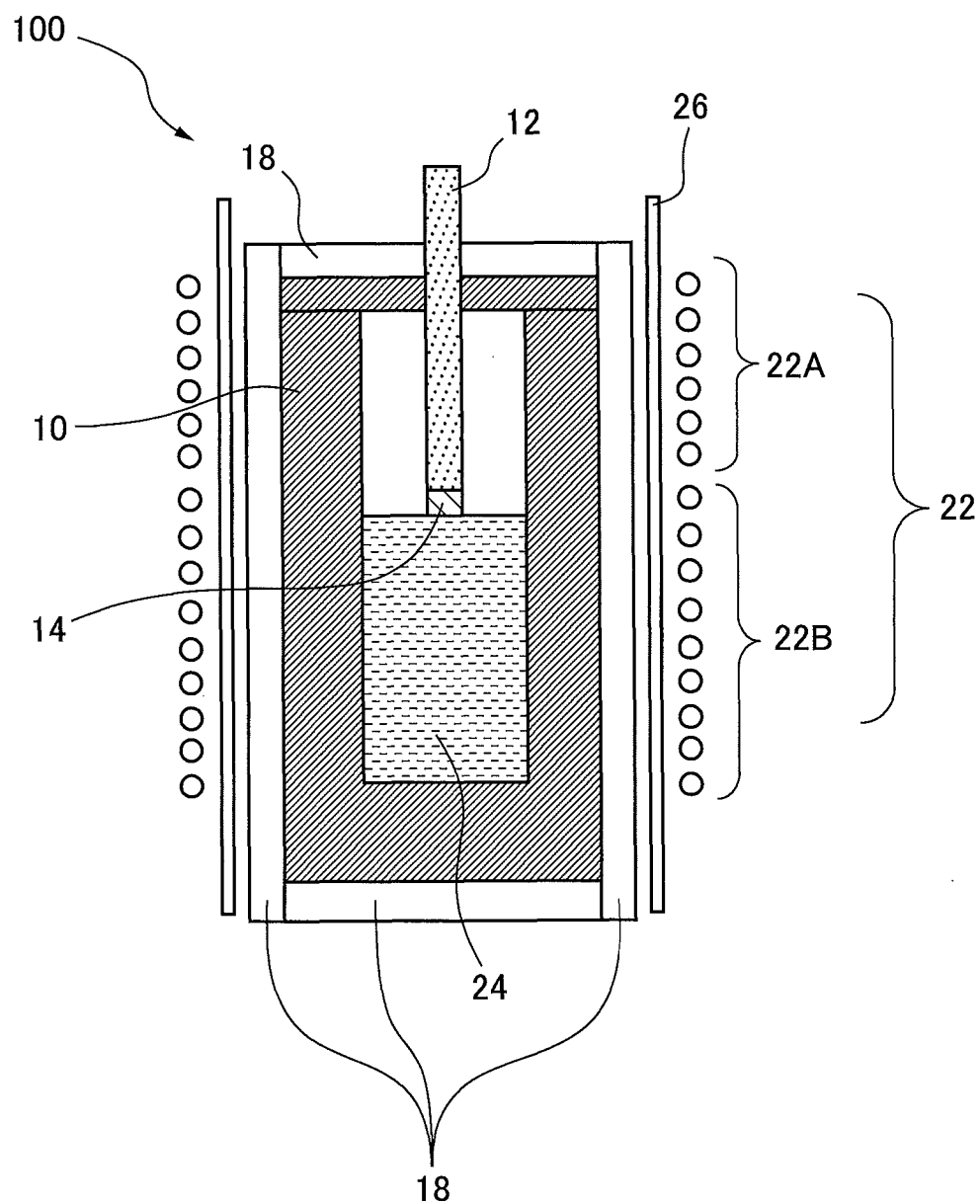
FIG. 1 is a cross-sectional schematic drawing of an example of a single crystal production apparatus based on a solution process, to be used for the method of the present disclosure.

Throughout the present specification, the indication "−1" in an expression, such as "(000-1) face", is used where normally a transverse line is placed over the numeral.

For growth of a SiC single crystal by a solution process, a relatively large amount of Al is added to the Si—C solution in order to grow a low-resistance p-type SiC single crystal. When a Si—C solution with a large amount of added Al has been used, inclusions have been generated in the grown crystal and it has not been possible to obtain a high-quality low-resistance p-type SiC single crystal.

The present inventors have conducted diligent research toward obtaining a low-resistance p-type SiC single crystal containing no inclusions, and have found that a low-resistance p-type SiC single crystal containing no inclusions can be grown by increasing the rate of crystallization of the grown crystal according to the increase of the additive amount of Al, it is possible to grow a low-resistance p-type SiC single crystal containing no inclusions.

The present disclosure is a method for producing a SiC single crystal wherein a SiC seed crystal substrate is contacted with a Si—C solution having a temperature gradient in which the temperature falls from the interior toward the surface, to grow a SiC single crystal, and wherein the method comprises:

using, as the Si—C solution, a Si—C solution containing Si, Cr and Al, wherein the Al content is 3 at % or greater based on the total of Si, Cr and Al, and making the temperature gradient y (° C./cm) in the surface region of the Si—C solution satisfy the following formula (1):

$$y \geq 0.15789x + 21.52632 \quad (1)$$

wherein x represents the Al content (at %) of the Si—C solution.

A solution process is used in the method of the present disclosure. A solution process is a process for producing a SiC single crystal wherein a SiC seed crystal substrate is contacted with a Si—C solution having a temperature gradient in which the temperature decreases from the interior toward the surface, to grow a SiC single crystal. By forming a temperature gradient in which the temperature decreases from the interior of the Si—C solution toward the surface of the solution, the surface region of the Si—C solution becomes supersaturated and a SiC single crystal is grown from the seed crystal substrate contacting with the Si—C solution.

As used herein, "inclusions" refers to components incorporated into the grown crystal from the Si—C solution (metal solvent) used for SiC single crystal growth.

Normally, in SiC single crystal growth, increasing the temperature gradient in the surface region of the Si—C solution under conditions with a dopant added to the Si—C solution cannot yield a high-quality single crystal, due to generation of inclusions, polycrystallization and the like. Surprisingly, however, it has been found that a low-resistance p-type SiC single crystal containing no inclusions can be grown if a Si—C solution containing Si, Cr and Al, wherein the Al content is 3 at % or greater based on the total of Si, Cr and Al, is used, and the temperature gradient y (° C./cm) in the surface region of the Si—C solution satisfies the following formula (1):

$$y \geq 0.15789x + 21.52632 \quad (1)$$

wherein x represents the Al content (at %) of the Si—C solution.

While it is not our intention to be constrained by theory, it is believed that when a Si—C solution with a high Al content is used for growth of a SiC single crystal at a small temperature gradient, the Al-containing solvent metal is resistant to crystallization and becomes incorporated into the grown crystal as an inclusion, but that when a Si—C solution with a high Al content is used for growth of a SiC single crystal at a large temperature gradient, the Al-containing solvent metal is more readily crystallized and a high-quality single crystal containing no inclusions can be obtained.

In the method of the present disclosure, the Si—C solution is a solution with C dissolved in a solvent which is a molten liquid containing Si, Cr and Al, wherein the Al content is 3 at % or greater based on the total amount of Si, Cr and Al.

The Al content of the Si—C solution is 3 at % or greater, preferably 5 at % or greater, more preferably 7 at % or greater and even more preferably 10 at % or greater, based on the total amount of Si, Cr and Al. If the Al content of the Si—C solution is within the above range, a low-resistance p-type SiC single crystal can be obtained.

The upper limit for the Al content of the Si—C solution is preferably no greater than 50 at %, more preferably no greater than 41 at %, even more preferably no greater than 33 at %, yet more preferably no greater than 20 at %, even yet more preferably no greater than 15 at % and most preferably no greater than 10 at %, based on the total amount of Si, Cr and Al. If the Al content of the Si—C solution is within the above range, a low-resistance p-type SiC crystal can be grown more stably.

The Cr content of the Si—C solution is preferably 20 to 60 at % based on the total amount of Si, Cr and Al.

The Si content of the Si—C solution is preferably 30 to 77 at % based on the total amount of Si, Cr and Al. If the Cr and Si contents of the Si—C solution are within these ranges, a low-resistance p-type SiC crystal can be grown more stably.

The Si—C solution may also contain other metals in addition to Si, Cr and Al. Such other metals are not particularly restricted so long as they can form a liquid phase (solution) that is in a state of thermodynamic equilibrium with the SiC (solid phase), and they may include Ti, Mn, Cr, Ni, Ce, Co, V and Fe, for example.

The Si—C solution is preferably a Si—C solution wherein the solvent is a molten liquid of Si/Cr/Al. A Si—C solution wherein the solvent is a molten liquid with an atomic composition percentage of Si/Cr/Al=30-77/20-60/3-50, has low variation in C dissolution and is therefore more preferred.

The temperature gradient in the surface region of the Si—C solution is in a range such that the temperature gradient y (° C./cm) satisfies formula (1):

$$y \geq 0.15789x + 21.52632 \quad (1)$$

wherein x represents the Al content (at %) of the Si—C solution. It is possible to obtain a low-resistance p-type SiC single crystal containing no inclusions by using the Si—C solution having the solvent composition with the above content of Al and limiting the temperature gradient in the surface region of the Si—C solution to the range specified above. The temperature gradient in the surface region of the Si—C solution is preferably 25° C./cm or greater with an Al content of the Si—C solution in the range of 3 to 20 (at %), more preferably 28° C./cm or greater with an Al content of the Si—C solution in the range of 3 to 41 (at %), and even more preferably 30° C./cm or greater with an Al content of the Si—C solution in the range of 3 to 53.6 (at %). The upper limit for the temperature gradient is preferably 55° C./cm, more preferably 50° C./cm and even more preferably 42° C./cm. The temperature gradient may be, for example, 25 to 55° C./cm, 28 to 55° C./cm or 30 to 42° C./cm. Furthermore, according to the method of the present disclosure it is possible to grow a low-resistance p-type SiC single crystal at a growth rate of preferably 600 μm/h or greater, more preferably 800 μm/h or greater and even more preferably 1000 μm/h or greater. The upper limit for the growth rate is preferably no greater than 1000 μm/h.

The temperature gradient in the surface region of the Si—C solution is the temperature gradient in the direction perpendicular to the liquid surface of the Si—C solution, wherein the temperature falls from the interior of the Si—C solution toward the surface of the solution. The temperature gradient can be calculated as the average value obtained by pre-measuring the temperature A on the surface (liquid surface) of the Si—C solution which is the low-temperature side, and the temperature B which is the high-temperature side at a prescribed depth from the surface of the Si—C solution in the direction perpendicular to the solution side, by using a thermocouple before contacting the seed crystal substrate with the Si—C solution, and dividing the temperature difference by the distance between the positions at which temperature A and temperature B were measured. For example, when measuring the temperature gradient between the surface of the Si—C solution and the position at depth D cm from the surface of the Si—C solution in the direction perpendicular to the solution side, calculation can be performed by the following formula:

$$\text{Temperature gradient (° C./cm)}=(B-A)/D$$

which is the difference between the surface temperature A of the Si—C solution and the temperature B at a position at depth D cm from the surface of the Si—C solution in the direction perpendicular to the solution side, divided by D cm.

The range in which the temperature gradient is controlled is to a depth of preferably 1 cm and more preferably 3 cm from the surface of the Si—C solution. When the temperature gradient is to be controlled up to a depth of 3 cm from the surface of the Si—C solution, the temperature gradient (° C./cm) in the formula is the value obtained when the difference between the surface temperature A of the Si—C solution and the temperature B at a position at a depth of 3 cm from the surface of the Si—C solution in the direction perpendicular to the solution side, is divided by 3 cm.

When the range of control of the temperature gradient is too shallow, the range in which the degree of supersaturation of C is controlled will also be shallow, sometimes causing growth of the SiC single crystal to be unstable. If the range of control of the temperature gradient is too deep, the range in which the degree of supersaturation of C is controlled will also be deep, which is effective for stable growth of the SiC single crystal, but in actuality the depth contributing to single crystal growth is very close to the surface of the Si—C solution and therefore it is sufficient to control the temperature gradient up to a depth of several mm from the surface. Consequently, in order to perform stable SiC single crystal growth and temperature gradient control, it is preferred to control the temperature gradient within the depth range specified above.

The method of the present disclosure allows growth of a low-resistance p-type SiC single crystal having resistivity of preferably 150 mΩ·cm or lower, more preferably 120 mΩ·cm or lower, even more preferably 100 mΩ·cm or lower, yet more preferably 70 mΩ·cm or lower and even yet more preferably 35 mΩ·cm or lower.

According to the method of the present disclosure it is possible to grow a low-resistance p-type SiC single crystal containing no inclusions. Judgment of the presence or absence of inclusions in the SiC crystal can be made based on observation using an optical microscope. For example, as shown in FIG. 2(a), the grown crystal 40 may be sliced parallel to the growth direction to cut a grown crystal 42 with a thickness of about 1 mm, as shown in FIG. 2(b), and then light may be directed from below and observation may be made of whether or not the entire surface of the grown crystal 42 is a continuous crystal based on a transmission image, to allow examination of the presence or absence of inclusions.

When the grown crystal 40 is grown in a substantially concentric manner, it may be further cut in half at the center section of the cut out grown crystal 42, and the presence of inclusions in the half-cut grown crystal 42 may be examined by the same method. Since inclusions tend to be generated particularly at the outer periphery, the outer periphery section alone may be cut to examine the presence or absence of inclusions at the outer periphery. The grown crystal may also be sliced perpendicular to the growth direction, and the presence of inclusions in the cut grown crystal may be examined by the same method. Alternatively, the grown crystal may be cut out as described above and subjected to energy dispersive X-ray spectroscopy (EDX) or wavelength dispersive X-ray analysis (WDX) for qualitative analysis or quantitative analysis of the Si—C solution component in the cut out grown crystal, to allow detection of inclusions.

Based on observation of the transmission image, the SiC single crystal portion appears semi-transparent or transparent, and the sections where inclusions are present are impervious to visible light and appear black, such that those sections can be detected as inclusions. According to elemental analysis by EDX or WDX, when a Si/Cr-based solvent is used as the Si—C solution, for example, it is analyzed whether solvent components other than Si and C, such as Cr, are present in the grown crystal, and the solvent components other than Si and C, such as Cr, can be detected as inclusions.

The seed crystal substrate to be used in the method of the present disclosure may be a SiC single crystal having quality commonly used for production of SiC single crystals. For example, a SiC single crystal commonly formed by a sublimation process may be used as the seed crystal substrate, and the seed crystal substrate may have any desired shape, such as plate-like, discoid, cylindrical, columnar, truncated circular conic or truncated pyramidal.

Placement of the seed crystal substrate in the single crystal production apparatus may be performed by holding the top face of the seed crystal substrate on the seed crystal holding shaft as described above. A carbon adhesive may be used for holding the seed crystal substrate on the seed crystal holding shaft.

Contact of the seed crystal substrate with the Si—C solution may be performed by lowering the seed crystal holding shaft holding the seed crystal substrate toward the Si—C solution surface, and contacting it with the Si—C solution while the bottom face of the seed crystal substrate is parallel to the Si—C solution surface. The seed crystal substrate may be held at a prescribed position relative to the Si—C solution surface for growth of the SiC single crystal.

Figure 3:
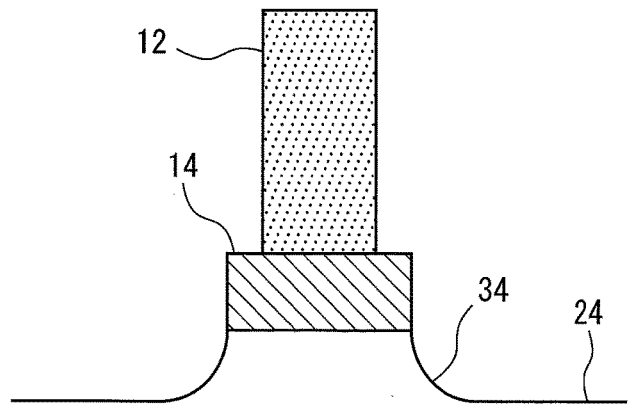
FIG. 3 is a cross-sectional schematic drawing of a meniscus formed between a seed crystal substrate and a Si—C solution.

The holding position for the seed crystal substrate may be such that the position of the bottom face of the seed crystal substrate matches the Si—C solution surface, is below the Si—C solution surface, or is above the Si—C solution surface. As shown in FIG. 3, the position of the bottom face of the seed crystal substrate is preferably above the Si—C solution surface, so that the Si—C solution 24 wets only the bottom face of the seed crystal substrate 14 to form a meniscus 34. When a meniscus is formed, the position of the bottom face of the seed crystal substrate is preferably held at a position 1 to 3 mm above the Si—C solution surface. When the seed crystal substrate is held so that the bottom face of the seed crystal substrate is at a position above the Si—C solution surface, the seed crystal substrate is contacted once with the Si—C solution so that the Si—C solution contacts with the bottom face of the seed crystal substrate, and it is then raised to the prescribed position.

The position of the bottom face of the seed crystal substrate may match the Si—C solution surface or be lower than the Si—C solution surface, but in order to prevent generation of polycrystals, it is preferable that the Si—C solution does not contact with the seed crystal holding shaft. In such methods, the position of the seed crystal substrate may be adjusted during growth of the single crystal.

In the method of the present disclosure, the lower limit for the surface temperature of the Si—C solution is preferably 1800° C. or higher and the upper limit is preferably 2200° C., as the dissolution of C in the Si—C solution can be increased within this temperature range.

Temperature measurement of the Si—C solution can be carried out by using a thermocouple or radiation thermometer. From the viewpoint of high temperature measurement and preventing inclusion of impurities, the thermocouple is preferably a thermocouple comprising a tungsten-rhenium wire covered with zirconia or magnesia glass, placed inside a graphite protection tube.

FIG. 1 shows an example of a SiC single crystal production apparatus for carrying out the invention. The illustrated SiC single crystal production apparatus 100 comprises a crucible 10 that receives a Si—C solution 24 having C dissolved in a molten liquid containing Si, Cr and Al, wherein a temperature gradient is formed in which the temperature is decreased from the interior of the Si—C solution toward the surface of the solution, and the seed crystal substrate 14 that is held at the tip of the vertically movable seed crystal holding shaft 12 is contacted with the Si—C solution 24 to allow growth of the SiC single crystal from the seed crystal substrate 14.

The Si—C solution 24 is prepared by loading the starting materials into the crucible, melting them by heating to prepare a molten liquid containing Si, Cr and Al, and dissolving C therein. If the crucible 10 is a carbonaceous crucible, such as a graphite crucible, or SiC crucible, C will dissolve into the molten liquid by dissolution of the crucible 10, thereby allowing a Si—C solution to be formed. This will avoid the presence of undissolved C in the Si—C solution 24, and prevent waste of SiC by deposition of the SiC single crystal onto the undissolved C. The supply of C may be performed by utilizing a method of, for example, blowing in hydrocarbon gas or loading a solid C source together with the molten liquid starting material, or these methods may be combined together with dissolution of the crucible.

For thermal insulation, the outer periphery of the crucible 10 is covered with a heat-insulating material 18. These are housed together inside a quartz tube 26. A high-frequency coil 22 for heating is disposed around the outer periphery of the quartz tube 26. The high-frequency coil 22 may be constructed from an upper level coil 22A and a lower level coil 22B, the upper level coil 22A and lower level coil 22B each being independently controllable.

Since the temperature of the crucible 10, heat-insulating material 18, quartz tube 26 and high-frequency coil 22 will be high, they are situated inside a water-cooling chamber. The water-cooling chamber is provided with a gas inlet and a gas exhaust vent to allow atmospheric modification in the apparatus.

The temperature of the Si—C solution usually has a temperature distribution with a lower temperature at the surface than the interior of the Si—C solution due to radiation and the like. Further, a temperature gradient can be formed in the Si—C solution 24 in the direction perpendicular to the surface of the Si—C solution 14 so that an upper portion of the solution contacting the seed crystal substrate 24 is at low temperature and a lower portion of the solution (the interior) is at high temperature, by adjusting the number of coils and spacing of the high-frequency coil 22, the positional relationship of the high-frequency coil 22 and the crucible 10 in the height direction, and the output of the high-frequency coil. For example, the output of the upper level coil 22A may be smaller than the output of the lower level coil 22B, to form a temperature gradient in the Si—C solution 24 in which an upper portion of the solution is at low temperature and a lower portion of the solution is at high temperature.

The C that has dissolved in the Si—C solution 24 is dispersed by diffusion and convection. In the region near the bottom face of the seed crystal substrate 14, a temperature gradient can be formed so that it is at lower temperature than the interior of the Si—C solution 24, due to control of output from the heating device, heat radiation from the surface of the Si—C solution 24 and heat loss through the seed crystal holding shaft 12. When the C that has dissolved into the solution interior that is at high temperature and has high solubility reaches the region near the seed crystal substrate that is at low temperature and has low solubility, a supersaturated state appears and a SiC single crystal is grown on the seed crystal substrate 14 by virtue of supersaturation as a driving force.

In one embodiment, meltback may be carried out in which the surface layer of the seed crystal substrate is dissolved in the Si—C solution and removed prior to growth of a SiC single crystal. Since the surface layer of the seed crystal substrate on which the SiC single crystal is grown may have an affected layer, such as a dislocation, a natural oxide film, or the like, removal of these by dissolution prior to growth of a SiC single crystal is effective for growing a high-quality SiC single crystal. Although the thickness of a layer to be dissolved depends on the processed conditions of the surface of a seed crystal substrate, it is preferably about 5 to 50 μm for sufficient removal of an affected layer and a natural oxide film.

The meltback may be performed by forming in the Si—C solution a temperature gradient in which the temperature increases from the interior of the Si—C solution toward the surface of the solution, i.e., by forming a temperature gradient in a direction opposite to the case of SiC single crystal growth. The temperature gradient in the opposite direction can be formed by controlling the output of the high-frequency coil.

In one embodiment, the seed crystal substrate may be preheated in advance, and then the same is contacted with the Si—C solution. If the seed crystal substrate at a low temperature is contacted with the Si—C solution at high temperature, heat shock dislocation may be generated in the seed crystal. Preheating of the seed crystal substrate before contacting the seed crystal substrate with the Si—C solution prevents heat shock dislocation and is effective for growth of a high-quality SiC single crystal. The seed crystal substrate may be heated together with the seed crystal holding shaft. In that case, heating of the seed crystal holding shaft is stopped after contact of the seed crystal substrate with the Si—C solution and before growth of the SiC single crystal. Alternatively, the Si—C solution may be heated to the temperature for crystal growth after contacting the seed crystal with the Si—C solution at a relatively low temperature. This is also effective for preventing heat shock dislocations and growing a high-quality SiC single crystal.

The present disclosure also relates to a p-type SiC single crystal containing no inclusions and having resistivity of no greater than 150 mΩ·cm.

The p-type SiC single crystal of the present disclosure has resistivity of preferably 120 mΩ·cm or lower, more preferably 100 mΩ·cm or lower, even more preferably 70 mΩ·cm or lower and yet more preferably 35 mΩ·cm or lower.

The lower limit for the resistivity of the p-type SiC single crystal of this disclosure is determined by the upper limit of the Al solid solution concentration in the SiC grown crystal, and it is approximately 35 mΩ·cm or greater.

The p-type SiC single crystal of the present disclosure can be obtained by the method for producing a SiC single crystal described above. Specifically, the p-type SiC single crystal is a SiC single crystal grown from a seed crystal substrate by a solution process, and after the SiC single crystal has been grown from the seed crystal substrate, the grown crystal can be obtained by cutting out from the Si—C solution and seed crystal substrate.

The contents, such as the method for judging the presence or absence of inclusions in the SiC grown crystal, as described for the method of the present disclosure, are applied in the same manner for the p-type SiC single crystal of the disclosure.

EXAMPLES

Example 1

A n-type SiC single crystal formed by a sublimation process, which was a discoid 4H—SiC single crystal with a diameter of 15 mm, a thickness of 700 μm, and the bottom face as the (000-1) face, was prepared for use as a seed crystal substrate. The seed crystal substrate had resistivity of 20 mΩ·cm. The top face of the seed crystal substrate was bonded to roughly the center section of the end face of a cylindrical graphite shaft, by using a graphite adhesive.

A single crystal production apparatus as shown in FIG. 1 was used, and Si/Cr/Al were loaded as a molten liquid materials for formation of a Si—C solution, at an atomic composition percentage of 58.2/38.8/3 (at %), into a graphite crucible for housing a Si—C solution. That is, the solvent composition of the Si—C solution was 58.2/38.8/3 (at %).

After vacuum suction of the interior of the single crystal production apparatus to $1\times10^{-3}$ Pa, argon gas was introduced to 1 atmosphere and the air inside the single crystal production apparatus was exchanged with argon. The high-frequency coil was electrified to melt the starting material in the graphite crucible by heating, thereby forming a Si/Cr/Al alloy molten liquid. Then, a sufficient amount of C was dissolved into the Si/Cr/Al alloy molten liquid from the graphite crucible to form a Si—C solution.

The outputs of the upper level coil and lower level coil were adjusted to heat the graphite crucible so that the temperature on the surface of the Si—C solution was increased to 2000° C. and a temperature gradient became 30° C./cm, in which the temperature decreased from the solution interior in a range of 1 cm from the Si—C solution surface, toward the solution surface. Temperature measurement of the surface of the Si—C solution was performed with a radiation thermometer, and measurement of the temperature gradient of the Si—C solution was performed using a vertically movable thermocouple.

Seed touching was performed, in which the position of the bottom face of the seed crystal substrate was placed at a position matching the liquid surface of the Si—C solution, and the bottom face of the seed crystal substrate was contacted with the Si—C solution, while keeping the bottom face of the seed crystal substrate bonded to the graphite shaft in parallel to the Si—C solution surface. The graphite shaft was then raised 1.5 mm so as to prevent the Si—C solution from seeping upward and contacting the graphite shaft, and was held at that position for 10 hours for growth of a crystal.

Upon completion of the crystal growth, the graphite shaft was raised and the seed crystal substrate and the SiC crystal grown from the seed crystal substrate were severed from the Si—C solution and the graphite shaft and were recovered. The obtained grown crystal had a diameter of 20 mm and a thickness of 6 mm, and the growth rate was 600 μm/h. The diameter of the obtained grown crystal is the diameter of the growth surface.

In order to measure the resistivity of the obtained grown crystal, the (0001) plane of the grown crystal was cut out from the growth surface to a thickness of 0.5 mm, mirror polished, worked to a 5 mm square, and cleaned, after which a circular Ni ohmic electrode with a diameter of 1 mm was formed by vacuum vapor deposition on the four corners of the (0001) plane. The electrode-attached grown crystal was used for Hall measurement by the Van der Pauw method at room temperature (25° C.), and measurement of the resistivity of the grown crystal revealed resistivity of 120 mΩ·cm, indicating that a p-type SiC single crystal was obtained.

Figure 2:
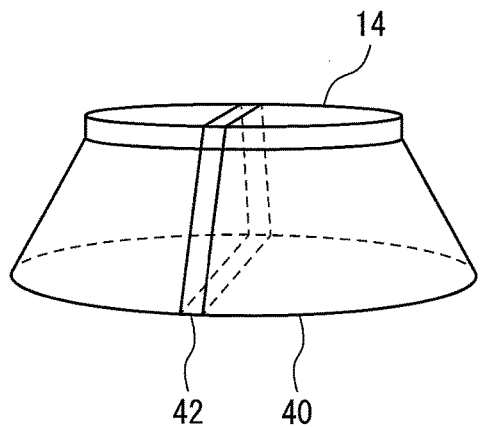
FIG. 2 is a pair of schematic diagrams showing the locations where a grown crystal is cut when examining the presence of inclusions in the grown crystal.
Figure 2:
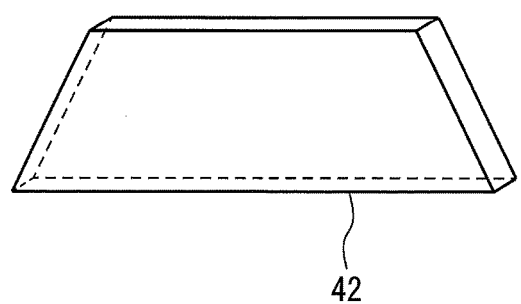

The obtained grown crystal was sliced parallel to the growth direction to cut out a 1 mm-thick grown crystal, as shown in FIG. 2, and upon observation with an optical microscope with light directed from below, no inclusions were found.

Example 2

Crystal growth was performed under the same conditions as Example 1, except that the solvent composition (Si/Cr/Al) of the Si—C solution was 54/36/10 (at %).

The obtained grown crystal was a p-type SiC single crystal with a diameter of 20 mm, a thickness of 6 mm and resistivity of 35 mΩ·cm, and no inclusions were found. The growth rate was 600 μm/h.

Example 3

Crystal growth was performed under the same conditions as Example 1, except that the solvent composition (Si/Cr/Al) of the Si—C solution was 54/36/10 (at %), the temperature gradient of the Si—C solution was 42° C./cm, and the growth time was 5 hours.

Figure 4:
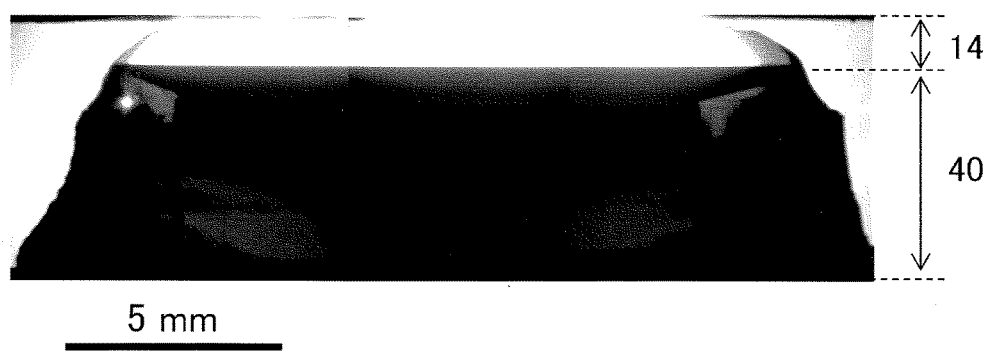
FIG. 4 is an optical microscope photograph of the cross-section of a grown crystal obtained in an example.

The obtained grown crystal was a p-type SiC single crystal with a diameter of 20 mm, a thickness of 5 mm and resistivity of 35 mΩ·cm, and no inclusions were found. The growth rate was 1000 μm/h. FIG. 4 shows an optical microscope photograph of the grown crystal observed with light directed from below, wherein the grown crystal was sliced parallel to the growth direction to cut out a 1 mm-thick grown crystal.

Example 4

Crystal growth was performed under the same conditions as Example 1, except that the temperature gradient of the Si—C solution was 55° C./cm and the growth time was 2 hours.

The obtained grown crystal was a p-type SiC single crystal with a diameter of 20 mm, a thickness of 2.4 mm and resistivity of 120 mΩ·cm, and no inclusions were found. The growth rate was 1200 μm/h.

Example 5

Crystal growth was performed under the same conditions as Example 1, except that the solvent composition (Si/Cr/Al) of the Si—C solution was 40.2/26.8/33 (at %) and the growth time was 5 hours.

The obtained grown crystal was a p-type SiC single crystal with a diameter of 20 mm, a thickness of 3 mm and resistivity of 35 mΩ·cm, and no inclusions were found. The growth rate was 600 μm/h.

Example 6

Crystal growth was performed under the same conditions as Example 1, except that the temperature gradient of the Si—C solution was 22° C./cm and the growth time was 5 hours.

The obtained grown crystal was a p-type SiC single crystal with a diameter of 20 mm, a thickness of 2.3 mm and resistivity of 120 mΩ·cm, and no inclusions were found. The growth rate was 460 μm/h.

Example 7

Crystal growth was performed under the same conditions as Example 1, except that the solvent composition (Si/Cr/Al) of the Si—C solution was 48/32/20 (at %), the temperature gradient of the Si—C solution was 25° C./cm, and the growth time was 5 hours.

The obtained grown crystal was a p-type SiC single crystal with a diameter of 20 mm, a thickness of 2.5 mm and resistivity of 35 mΩ·cm, and no inclusions were found. The growth rate was 500 μm/h.

Example 8

Crystal growth was performed under the same conditions as Example 1, except that the solvent composition (Si/Cr/Al) of the Si—C solution was 35.4/23.6/41 (at %), the temperature gradient of the Si—C solution was 28° C./cm, and the growth time was 5 hours.

The obtained grown crystal was a p-type SiC single crystal with a diameter of 20 mm, a thickness of 3 mm and resistivity of 35 mΩ·cm, and no inclusions were found. The growth rate was 600 μm/h.

Comparative Example 1

Crystal growth was performed under the same conditions as Example 1, except that the solvent composition of the Si—C solution was 59.4/39.6/1 (at %) and the temperature gradient of the Si—C solution was 15° C./cm.

The obtained grown crystal was a p-type SiC single crystal with a diameter of 20 mm, a thickness of 3 mm and resistivity of 1200 mΩ·cm, and no inclusions were found. The growth rate was 300 μm/h.

Comparative Example 2

Crystal growth was performed under the same conditions as Example 1, except that the temperature gradient of the Si—C solution was 15° C./cm.

The obtained grown crystal was a p-type SiC single crystal with a diameter of 20 mm, a thickness of 3 mm and resistivity of 120 mΩ·cm, but inclusions were found. The growth rate was 300 μm/h.

Comparative Example 3

Crystal growth was performed under the same conditions as Example 1, except that the solvent composition of the Si—C solution was 54/36/10 (at %), the temperature gradient of the Si—C solution was 15° C./cm, and the growth time was 20 hours.

Figure 5:
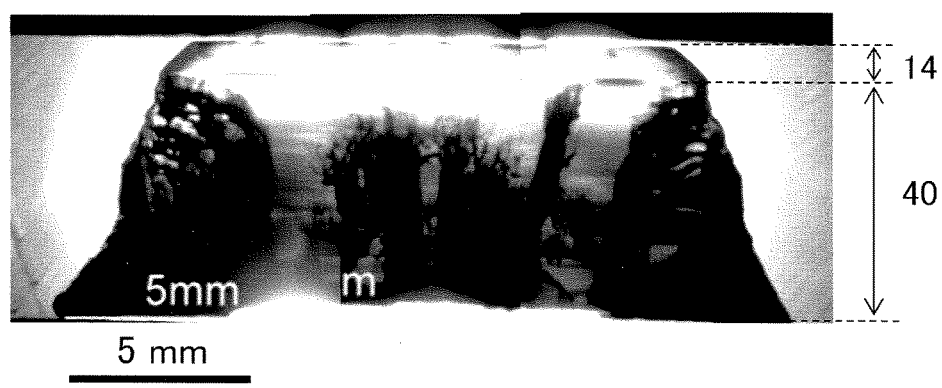
FIG. 5 is an optical microscope photograph of the cross-section of a grown crystal obtained in a comparative example.

The obtained grown crystal was a p-type SiC single crystal with a diameter of 20 mm, a thickness of 6 mm and resistivity of 35 mΩ·cm, but inclusions were found. The growth rate was 300 μm/h. FIG. 5 shows an optical microscope photograph of the grown crystal observed with light directed from below, wherein the grown crystal was sliced parallel to the growth direction to cut out a 1 mm-thick grown crystal.

Comparative Example 4

Crystal growth was performed under the same conditions as Example 1, except that the solvent composition (Si/Cr/Al) of the Si—C solution was 35.4/23.6/41 (at %), the temperature gradient of the Si—C solution was 20° C./cm, and the growth time was 5 hours.

The obtained grown crystal was a p-type SiC single crystal with a diameter of 20 mm, a thickness of 2.3 mm and resistivity of 35 mΩ·cm, but inclusions were found. The growth rate was 460 μm/h.

Table 1 shows the main growth conditions in Examples 1 to 8 and Comparative Examples 1 to 4, and the presence or absence of inclusions and the resistivity for the grown crystals obtained in Examples 1 to 8 and Comparative Examples 1 to 4.

TABLE 1

|  | Si/Cr/Al (at %) | Al addition (at %) | Temperature gradient (° C./cm) | Growth time (h) | Inclusions | Resistivity (mΩ · cm) |
| --- | --- | --- | --- | --- | --- | --- |
| Example 1 | 58.2/38.8/3 | 3 | 30 | 10 | Absent | 120 |
| Example 2 | 54/36/10 | 10 | 30 | 10 | Absent | 35 |
| Example 3 | 54/36/10 | 10 | 42 | 5 | Absent | 35 |
| Example 4 | 58.2/38.8/3 | 3 | 55 | 2 | Absent | 120 |
| Example 5 | 40.2/26.8/33 | 33 | 30 | 5 | Absent | 35 |
| Example 6 | 58.2/38.8/3 | 3 | 22 | 5 | Absent | 120 |
| Example 7 | 48/32/20 | 20 | 25 | 5 | Absent | 35 |
| Example 8 | 35.4/23.6/41 | 41 | 28 | 5 | Absent | 35 |
| Comp. Ex. 1 | 59.4/39.6/1 | 1 | 15 | 10 | Absent | 1200 |
| Comp. Ex. 2 | 58.2/38.8/3 | 3 | 15 | 10 | Present | 120 |
| Comp. Ex. 3 | 54/36/10 | 10 | 15 | 20 | Present | 35 |
| Comp. Ex. 4 | 35.4/23.6/41 | 41 | 20 | 5 | Present | 35 |

The following table shows the growth rates and the thicknesses for the grown crystals obtained in Examples 1 to 8 and Comparative Examples 1 to 4.

TABLE 2

|  | Growth rate (μm/h) | Thickness of grown crystal (mm) |
| --- | --- | --- |
| Example 1 | 600 | 6 |
| Example 2 | 600 | 6 |
| Example 3 | 1000 | 5 |
| Example 4 | 1200 | 2.4 |
| Example 5 | 600 | 3 |
| Example 6 | 460 | 2.3 |
| Example 7 | 500 | 2.5 |
| Example 8 | 600 | 3 |
| Comp. Ex. 1 | 300 | 3 |
| Comp. Ex. 2 | 300 | 3 |
| Comp. Ex. 3 | 300 | 6 |
| Comp. Ex. 4 | 460 | 2.3 |

Figure 6:
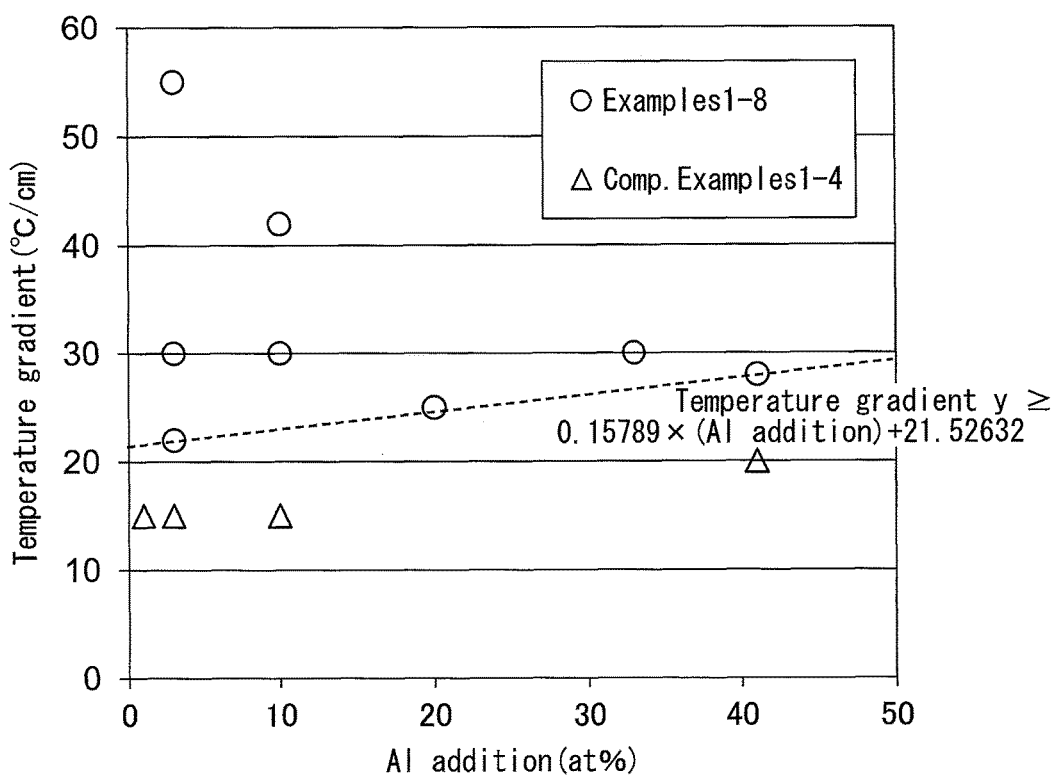
FIG. 6 is a graph showing the presence or absence of inclusions in grown crystals obtained in the examples and comparative examples, as a function of the relationship between the Al content of the Si—C solution and the temperature gradient.

FIG. 6 shows a graph representing the presence or absence of inclusions in the grown crystals obtained in Examples 1 to 8 and Comparative Examples 1 to 4, as a function of the relationship between the Al contents and temperature gradients of Si—C solutions.

EXPLANATION OF SYMBOLS

100 Single crystal production apparatus
10 Crucible
12 Seed crystal holding shaft
14 Seed crystal substrate
18 Heat-insulating material
22 High-frequency coil
22A Upper level high-frequency coil
22B Lower level high-frequency coil
24 Si—C solution
26 Quartz tube
34 Meniscus
40 SiC grown crystal
42 Cut grown crystal

What is claimed is:

1. A method for producing a SiC single crystal wherein a SiC seed crystal substrate is contacted with a Si—C solution having a temperature gradient in which temperature falls from an interior toward a surface, to grow the SiC single crystal, the method comprising:

using, as the Si—C solution, a solution containing Si, Cr and Al, wherein an Al content is 3 at % or greater based on a total of Si, Cr and Al; and making a temperature gradient y (° C./cm) in a surface region of the Si—C solution satisfy the following formula (1):

$$y \geq 0.15789x + 21.52632 \qquad (1)$$

wherein x represents the Al content (at %) of the Si—C solution.

2. The method for producing a SiC single crystal according to claim 1, comprising limiting the temperature gradient in the surface region of the Si—C solution to a range of 28 to 55° C./cm with the Al content in a range of 3 to 41 (at %) in the Si—C solution.

* * * * *